United States Patent
Davis et al.

(10) Patent No.: US 10,535,463 B2
(45) Date of Patent: Jan. 14, 2020

(54) METHOD OF CONSTRUCTING A CYLINDRICAL SUPERCONDUCTING MAGNET COIL ASSEMBLY

(71) Applicant: SIEMENS HEALTHCARE LIMITED, Camberley (GB)

(72) Inventors: Peter Jonathan Davis, Oxford (GB); David William Ford, Oxfordshire (GB); Matthew John Longfield, Oxfordshire (GB)

(73) Assignee: Siemens Healthcare Limited, Camberley (GB)

( * ) Notice: Subject to any disclaimer, the term of this patent is extended or adjusted under 35 U.S.C. 154(b) by 282 days.

(21) Appl. No.: 15/502,389

(22) PCT Filed: Jul. 23, 2015

(86) PCT No.: PCT/EP2015/066933
§ 371 (c)(1),
(2) Date: Feb. 7, 2017

(87) PCT Pub. No.: WO2016/020205
PCT Pub. Date: Feb. 11, 2016

(65) Prior Publication Data
US 2017/0229239 A1      Aug. 10, 2017

(30) Foreign Application Priority Data
Aug. 7, 2014   (GB) .................................. 1413974.5

(51) Int. Cl.
*H01L 39/24*      (2006.01)
*H01F 41/04*      (2006.01)
*H01F 41/064*    (2016.01)

(52) U.S. Cl.
CPC ......... *H01F 41/048* (2013.01); *H01F 41/064* (2016.01)

(58) Field of Classification Search
CPC .... H01F 41/048; H01F 41/064; H01F 41/127; H01F 6/06; G01R 33/3815; G01R 33/3873; G01R 33/3802; Y10T 29/49014; Y10T 29/4902; Y10T 29/49071
USPC ....................................... 29/599, 602.1, 605
See application file for complete search history.

(56) References Cited

U.S. PATENT DOCUMENTS

| | | | |
|---|---|---|---|
| 4,591,790 A | 5/1986 | Takahashi | |
| 4,679,020 A | 7/1987 | Kawamura et al. | |
| 4,896,128 A | 1/1990 | Wollan et al. | |
| 4,956,608 A | 9/1990 | Dorri et al. | |
| 5,210,512 A * | 5/1993 | Davies .............. | G01R 33/3815 335/216 |
| 5,212,416 A | 5/1993 | Shimizu et al. | |

(Continued)

FOREIGN PATENT DOCUMENTS

| | | |
|---|---|---|
| CN | 203103043 U | 7/2013 |
| CN | 203745629 U | 7/2014 |

(Continued)

*Primary Examiner* — Donghai D Nguyen
(74) *Attorney, Agent, or Firm* — Schiff Hardin LLP

(57) ABSTRACT

A cylindrical superconducting coil assembly has multiple individual coil units stacked together and retained in place by retaining structures, each coil unit having a resin-impregnated annular superconducting coil bonded at its axial extremities to respective rings of non-ferromagnetic material.

3 Claims, 8 Drawing Sheets

(56) References Cited

U.S. PATENT DOCUMENTS

| | | | |
|---|---|---|---|
| 5,787,714 A * | 8/1998 | Ohkura | H01F 6/04 62/437 |
| 9,536,659 B2 | 1/2017 | Calvert et al. | |
| 2012/0068804 A1 | 3/2012 | Dunckley et al. | |

FOREIGN PATENT DOCUMENTS

| | | | |
|---|---|---|---|
| GB | 2503190 A | 12/2013 | |
| GB | 2521470 A | 6/2015 | |
| JP | S59208811 A | 11/1984 | |
| JP | H0458503 A | 2/1992 | |
| JP | 2008244284 A | 10/2008 | |
| JP | 2013219195 A | 10/2013 | |
| JP | 2014022543 A | 2/2014 | |

* cited by examiner

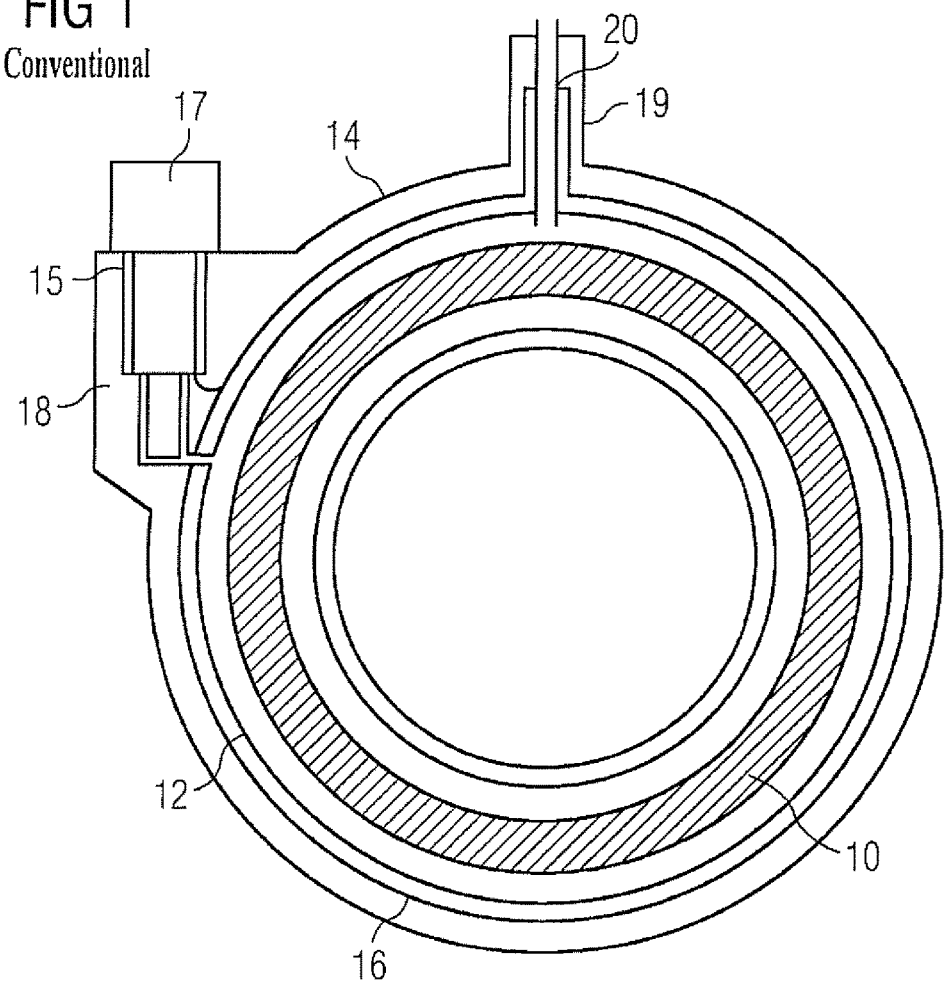
FIG 1
Conventional

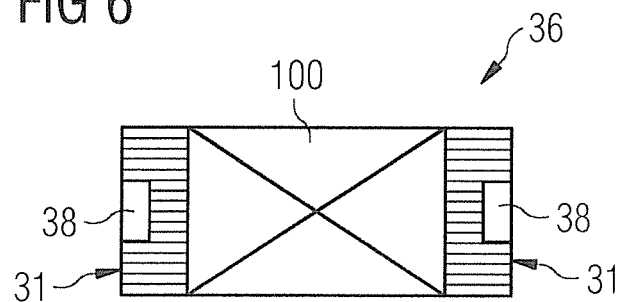
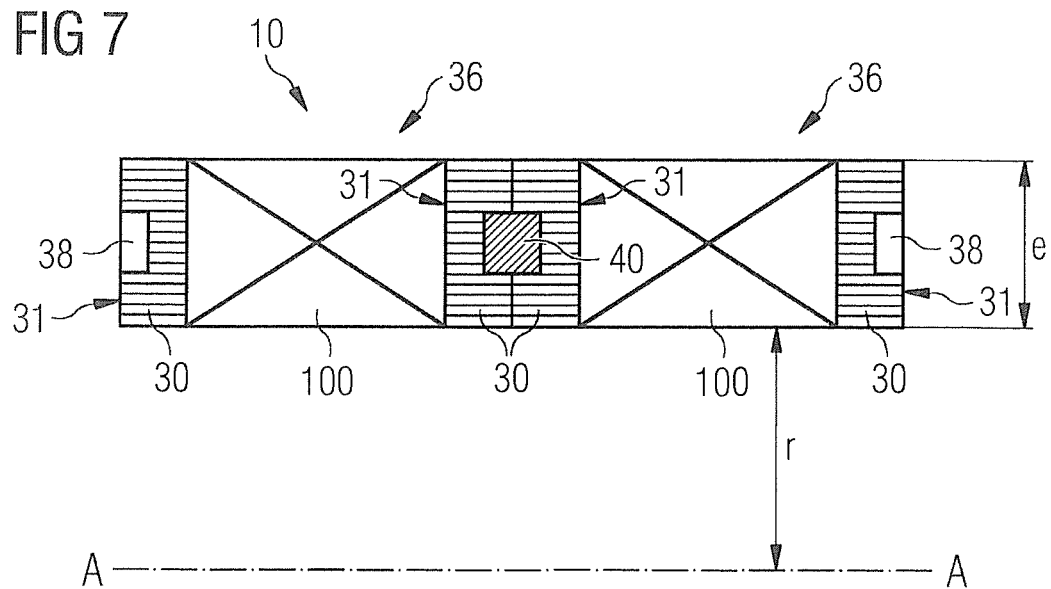

METHOD OF CONSTRUCTING A CYLINDRICAL SUPERCONDUCTING MAGNET COIL ASSEMBLY

BACKGROUND OF THE INVENTION

Field of the Invention

The present invention provides cylindrical superconducting magnet coil structures, for example as used in Magnetic Resonance Imaging (MRI) systems. Such magnets must be cooled to below the transition temperature of the superconducting wire used which requires the superconducting magnet coil structure to be placed in a cryostat to isolate it from ambient temperature.

Description of the Prior Art

FIG. 1 shows an example conventional arrangement of a cryostat including a cryogen vessel 12. A superconducting magnet comprises a coil structure 10 within cryogen vessel 12, itself retained within an outer vacuum chamber (OVC) 14. One or more thermal radiation shields 16 are provided in a vacuum space between the cryogen vessel 12 and the outer vacuum chamber 14. In some known arrangements, a refrigerator 17 is mounted in a refrigerator sock 15 located in a turret 18 provided for the purpose, towards the side of the cryostat. Alternatively, a refrigerator 17 may be located within access turret 19, which retains access neck (vent tube) 20 mounted at the top of the cryostat. The refrigerator 17 provides active refrigeration to cool cryogen gas within the cryogen vessel 12, in some arrangements by recondensing it into a liquid. The refrigerator 17 may also serve to cool the radiation shield 16. As illustrated in FIG. 1, the refrigerator 17 may be a two-stage refrigerator. A first cooling stage is thermally linked to the radiation shield 16, and provides cooling to a first temperature, typically in the region of 80-100K. A second cooling stage provides cooling of the cryogen gas to a much lower temperature, typically in the region of 4-10K.

SUMMARY OF THE INVENTION

The present invention provides a superconducting magnet coil structure 10 such as discussed above, which may be placed within a cryogen vessel 12, or cooled by other means.

In an example of a conventional superconducting magnet structure, coils are wound into cavities defined on a radially outer surface of a cylindrical former, for example of aluminum. The coils are then impregnated with a thermosetting resin.

In any such method where a number of coils are wound and impregnated at the same time, there is a risk that a manufacturing defect in one coil cannot be corrected, resulting in scrapping of the whole impregnated structure. Manufacturing defects such as electrical shorts and impregnation failures are known, but would not become apparent until after impregnation is complete, and the structure removed from its mold. It would be advantageous to provide a method for manufacturing a superconducting coil assembly wherein individual coils may be inspected for defects and replaced if necessary after the impregnation step.

The present invention provides a superconducting magnet coil structure that addresses some of the disadvantages of the conventional structure described above.

The present invention particularly addresses superconducting coil assemblies of a so-called "serially bonded" construction. In such arrangements, coils are joined by spacers to keep then at a desired axial spacing and axial alignment. The coils and the spacers are bonded together to form a self-supporting structure.

The present invention also seeks to provide a structure and assembly technique that allows the coils to be aligned correctly, and allows for replacement of defective coils during manufacture by the use of separate coil units, and allows adjustment in the relative positions of the coils.

BRIEF DESCRIPTION OF THE DRAWINGS

FIG. 1 schematically shows a conventional arrangement of a superconducting magnet within a cryostat.

FIG. 6 schematically shows a coil unit according to an aspect of the present invention.

FIG. 7 schematically shows a coil structure according to an embodiment of the present invention.

DESCRIPTION OF THE PREFERRED EMBODIMENTS

Figure 2:
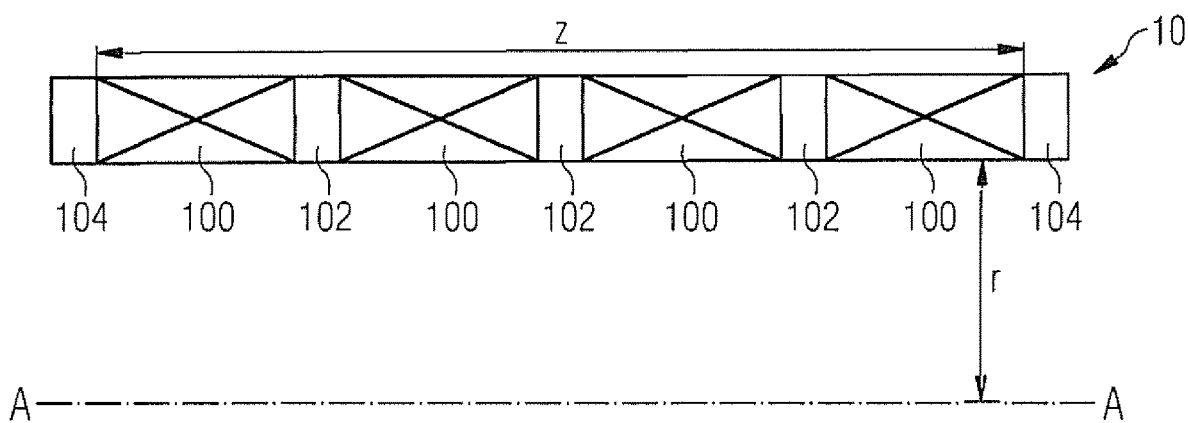
FIG. 2 schematically shows a half-cross-section of a serially bonded coil assembly, to which the present invention may be applied.

The present invention relates to serially-bonded coil structures. An example of a serially-bonded coil structure 10 is shown in FIG. 2 as a schematic half-cross-section. The structure is essentially rotationally symmetrical about axis A-A. The terms "radial" and "axial" and similar terms will be used herein to denote directions and dimensions which are respectively: "perpendicular to the axis A-A and extending in a plane which contains the axis A-A"; and "parallel or co-incident with the axis A-A". Similarly, terms such as "outer" and "inner" refer to relative proximity to the midpoint of axis A-A. Dimension r is typically about 50 cm, and dimension z is typically about 150 cm for an MRI Magnet, and smaller dimensions for a typical NMR magnet. A number of coils 100 of superconducting wire are provided, each impregnated with a material such as a thermosetting resin, as is conventional in itself. Coils 100 are separated by spacers 102. The spacers may be composed of wire, such as resistive copper wire, wound into coils and impregnated with an impregnating material such as a thermosetting resin;

or may be composed of an inert material such as glass fiber cloth or filament, wound and impregnated with a similar impregnating material. The coils are of axial and radial dimensions determined to fulfil their function as sources of magnetic field and to allow robust and not unduly troublesome manufacture, as will be apparent to those skilled in the art. As is also apparent to one skilled in the art, a given objective of magnetic field strength, field homogeneity and dimensions of the homogeneous region may be achieved by a number of different arrangements of coils, having different dimensions, spacing and number. The designer will choose an appropriate arrangement based on other constraints particular to the design in question.

An example method of manufacture of such a serially bonded coil structure 10 according to an aspect of the present invention may proceed as follows.

In an embodiment of the invention, the coil assembly 10 is not formed of separate coils 100 and spacers 102 bonded together by a thermosetting resin or similar, but rather, individually formed and impregnated coil units may be stacked together and retained in place by retaining structures.

Figure 13:
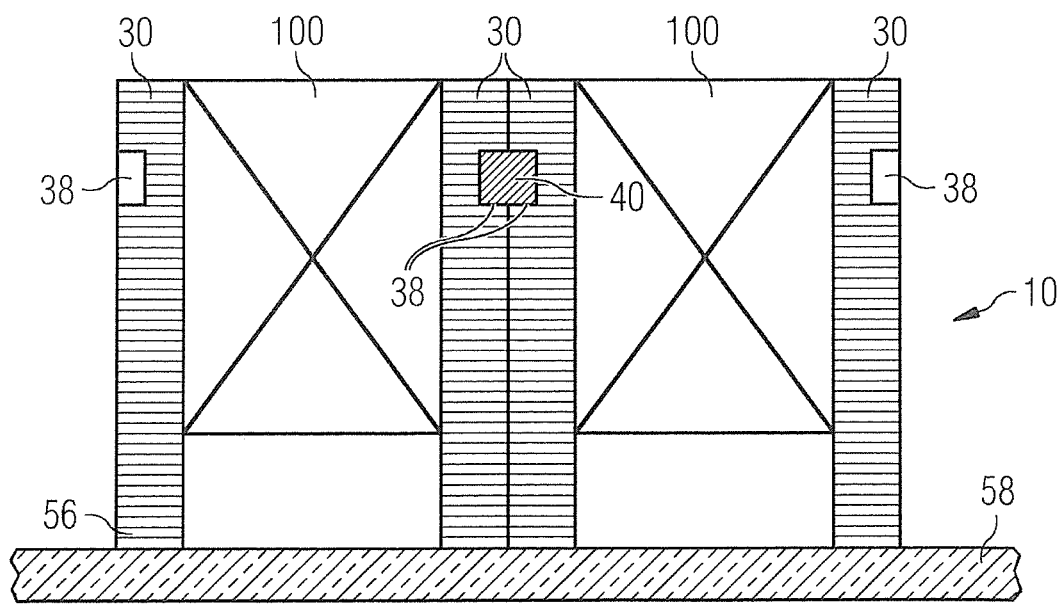
Figure 14:
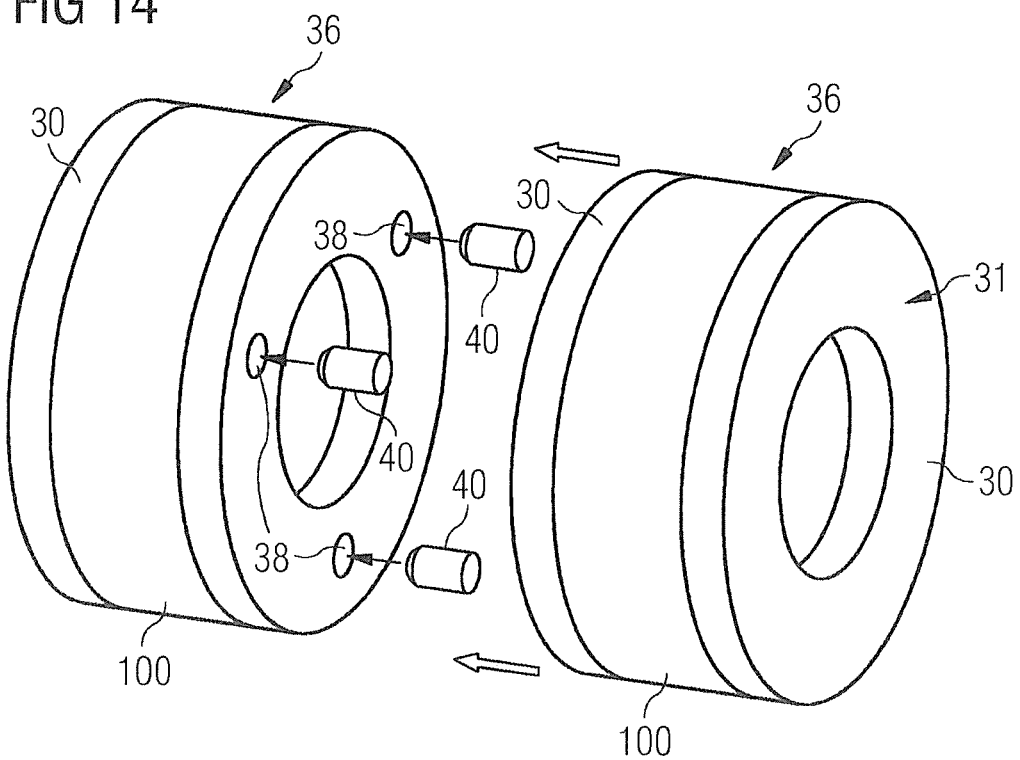
FIG. 14 schematically illustrates a perspective view of a coil assembly according to an embodiment of the present invention.

Preferably, in such arrangements, some alignment formations are provided to ensure that the coils and spacers are placed in correct alignment during assembly, and remain correctly aligned throughout their service life. For example, as shown in FIG. 14, complementary recesses 80 and projections 82 may be formed in axial end-faces of coil units. In preferred arrangements, and as shown in FIG. 13, recesses 38 are provided in axial end-faces of all coil units, with dowels 40 placed within recesses of adjacent coil units, to ensure the required alignment.

Once assembled, the coil units may be bonded to one another, according to certain embodiments of the invention. In other embodiments of the invention, the coil units may be mechanically fixed together, for example by compression or by a bolting arrangement.

Figure 3:
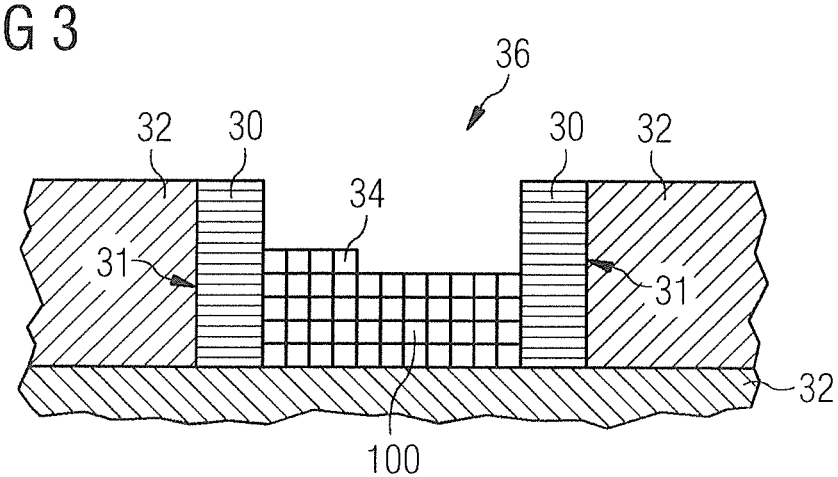
FIG. 3 schematically shows a part-wound coil unit according to an embodiment of the present invention.

FIG. 3 illustrates a step in a particularly preferred assembly method, according to an aspect of the present invention. The illustrated axial half-cross-section of a part-finished coil unit is symmetrical about axis A-A. Non-ferromagnetic rings 30 of GRP, PTFE or similar are pre-formed, and placed in a mold 32 to define axial extremities of a coil to be wound. Mold 32 may be a multi-part mold, as illustrated, which may be disassembled to remove the molded structure when complete. Superconducting wire 34 is then wound into the mold, between the rings 30, to form a coil 100, shown partially complete in FIG. 3.

Figure 4:
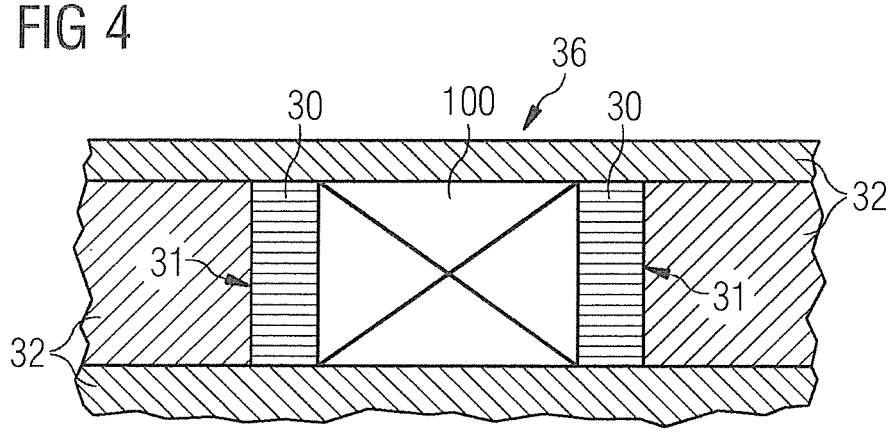
FIG. 4 schematically shows a later step in the production of a coil unit according to an embodiment of the present invention.

As shown in FIG. 4, once the coil is complete, the mold is then closed, and the resulting ring/coil structure 36 is then impregnated with a thermosetting resin or similar, which is caused or allowed to harden. The resulting structure comprises a self-supporting impregnated coil 100 bonded at its axial extremities to the non-ferromagnetic rings 30. This will be referred to herein as a "coil unit".

The spacer rings 30 may be manufactured using the same tooling as used for the magnet coils. For example, the tooling may be used in a two stage process of firstly winding and impregnating the wound glass cloth, or alternative fiber material such as glass strands or carbon fiber cloth, into the mold, then removing part of the tooling either side of which the glass cloth was impregnated, and winding the superconducting wire between the spacer rings which are already impregnated. The impregnating material used in the spacer rings to may be caused or allowed to harden before the superconducting wire is wound between the rings. Alternatively, the superconducting wire may be wound while the impregnating material used in the spacer rings is uncured, a single curing step being carried out to cause or allow the impregnating material of the rings and of the coils to harden together. An advantage of such a method is the reduce time and cost, and improved accuracy, of making the spacer rings. Such an embodiment is shown in FIGS. 5A-5E.

Figure 5A:
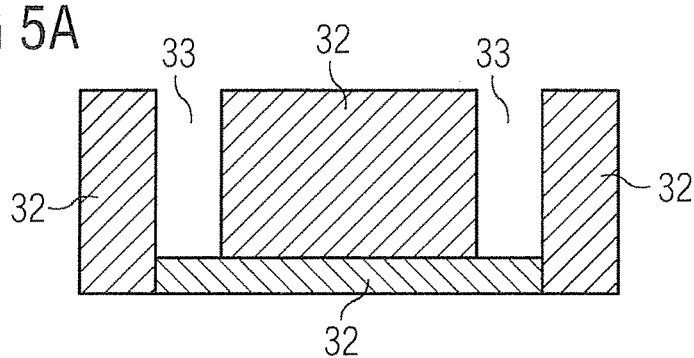
FIGS. 5A-5E schematically illustrate steps in a method of manufacturing a coil unit according to certain steps in a method of the present invention.

FIG. 5A shows a multi-part mold 32 into which a superconducting coil 100 and spacer rings 30 will be wound and impregnated. In the configuration illustrated in FIG. 5A, cavities 33 are left for formation of spacer rings 30.

Figure 5B:
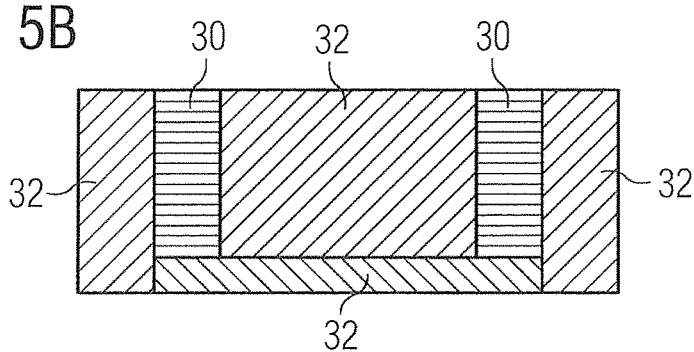

FIG. 5B shows fibrous spacer ring material wound into the cavities 33 of FIG. 5A to form spacer rings 30. Preferably, the spacer ring material is wet wound, pre-impregnated with a resin or similar impregnating material. The impregnating material may be caused or allowed to harden before a central mold piece is removed to open a cavity 35 for winding of a coil 100.

Figure 5C:
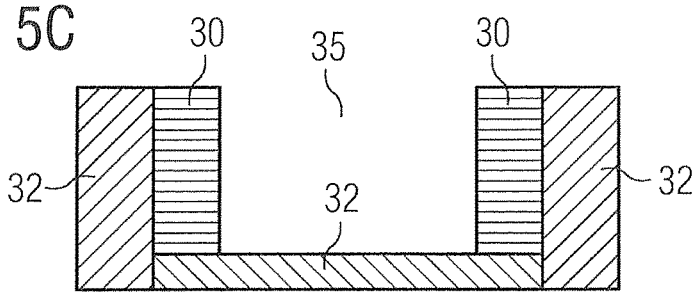

FIG. 5C shows the removal of the central mold piece and the cavity 35 for winding of a coil. Depending on eth chosen embodiment, the end ring material 30 may be impregnated and cured, impregnated and uncured, or not impregnated at this stage. Superconducting wire is then wound by a known method into the cavity 35.

Figure 5D:
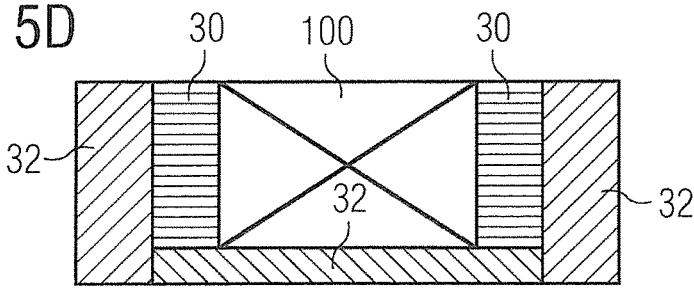

FIG. 5D shows the superconducting wire wound into cavity 35 to form coil 100. The superconducting wire may be wet-wound—that is, provided with a coating of uncured resin so that the coil becomes impregnated with resin as it is wound—or dry-wound—that is, wound without any coating of resin. If the coil and/or the spacer ring is/are not impregnated at this stage, an impregnation step will be performed. If the impregnation material in the coil and/or the spacer ring is/are not cured at this stage, a curing step will be performed to cause or allow the uncured resin to harden.

Figure 5E:
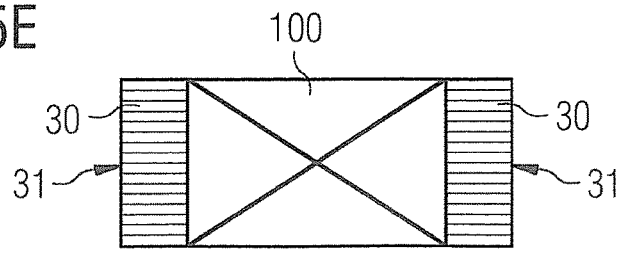

FIG. 5E shows the resultant coil unit removed from the mold 32, with spacer rings 30 bonded to coil 100 by the impregnating material, typically a thermoset resin.

The fibrous spacer ring material is selected to provide required thermal and mechanical properties. Winding tension of the fibrous spacer ring material may be increased as required to adjust the resin-to-fiber content in the radial direction to provide a spacer ring 30 with thermal properties which match the thermal properties of the impregnated superconducting coil 100.

Although not illustrated in FIGS. 5A-5E, it is necessary to provide a leadout arrangement so that both ends of the wire used to wind the coil 100 are accessible for electrical connection. In one embodiment, leadout slots may be provided within the spacer rings, made from pre-molded inserts around which the glass cloth is wound. A first end of the wire will be placed in this leadout slot before winding. The second end of the wire, after winding, will be exposed on the radially outer surface of the coil.

The axial end-faces of the non-ferromagnetic rings of each coil unit are then cleaned, if required, and machined flat if necessary.

The axial dimensions of the coil units are preferably measured at various stages of manufacture. The coil unit faces 31 can be machined to remove axial extremities of rings 30 and provide coil units 36 with a required axial dimension. The coil units are then stacked together to form a complete magnet structure. The rings of adjacent coil units 36 are placed adjacent to one another and effectively form spacers akin to the spacers 102 described with reference to FIG. 2.

The coil unit faces 31 can be machined to provide relatively thin spacers, of axial dimension that may not be achievable with conventional assembly techniques. According to this feature of the present invention, relatively thick self-supporting rings 30 are bonded to coils 100 as part of coil units 36, and the rings are then machined to reduce their axial dimension. During this process, the rings are supported by being bonded to the coils 100.

By such method, high axial dimensional accuracies may be achieved, as needed to accurately position and align each coil to achieve a required homogeneity of the magnet field of the finished superconducting magnet with minimal active or passive shimming.

By enabling spacers 102 of small axial dimension, the present invention enables superconducting magnet structures to be produced with a large proportion of superconducting wire. Such structures manufactured by conventional techniques tend to be highly sensitive to the homogeneity of the magnetic field and to require costly superconductive shims. With the present application, as will be explained, it is simple to adjust the relative positioning of superconductive coils to ensure a required homogeneity in the magnetic field in the imaging region.

In the illustrated embodiment, as shown in FIG. 6, recesses 38 are provided in the non-ferromagnetic spacer rings 30 at predetermined locations. It may be preferred to provide spacer rings 30 of a greater axial extent than required, and then machine spacer rings 30 to the required axial dimension. A selection of final axial dimensions of rings 30 may be provided by machining rings 30 as appropriate. FIG. 6 shows a part-axial cross-section of the structure at this stage. Recesses 38 are provided at corresponding locations in at least one other coil unit 36 which is to be assembled next to the first.

Recesses 38 may be accurately located in the spacer rings 30, as they are formed after impregnation and machining of the coil unit 36. The positioning of the recesses can be referenced to the inner diameter of the coil 100 and to each spacer face 31. In conventional assembly methods, such recesses would have been machined into separate component parts, such as separate spacer rings. On assembly, manufacturing tolerances would accumulate to provide greater uncertainty in the positioning of the recesses.

FIG. 7 shows a schematic axial part-cross-section of a partially complete superconducting coil structure 10 according to an embodiment of the present invention. Two coil units 36 are assembled axially adjacent to one another. They may have the same, or differing axial extents or proportions. Typically, they will have identical inner radii r, although the present invention does not require this feature. Dowels 40, of a non-ferromagnetic material such as GRP, PTFE stainless steel, brass or other such materials are placed in the recesses 38 of one ring 30, and when the coil units 36 are assembled together, each dowel 40 protrudes into a corresponding recess 38 in two adjacent coil units 36. The recesses and dowels should be precisely dimensioned to provide a required degree of alignment of the coils. Although illustrated herein as having circular cross-sections, the dowels 40 and recesses 38 may have cross-sections of any appropriate shape.

In some embodiments, dowels 40 and recesses 38 fit tightly, to provide precise alignment. In other embodiments, some play is provided, to allow adjustment after assembly, for example before bonding together coil units 36.

In the illustrated embodiments, the recesses 38 and dowels 40 are positioned at a radial distance from the axis A-A within a radial extent e of coil 100 within the corresponding coil units 36.

Once assembled, a magnetic field generated by the coils 100 may be measured. This can be done at room temperature by passing a current through cladding material, typically copper, typically provided around superconducting cores within the superconducting wire. The resultant magnetic field will have homogeneity similar to that of the field the magnet would provide when superconducting. According to the present invention, the homogeneity of the magnet structure may be measured in this way, and the homogeneity of the magnetic field may be improved by dismantling the structure, performing further machining steps of the rings 30 of one or more coil units to bring adjacent coils closer to one another. If required, shim pieces may be introduced between adjacent coils units to effectively increase separation between adjacent coils 100. The magnetic field may be measured (plotted) again, and the process repeated iteratively if required until satisfactory magnetic field homogeneity is acquired. Such methods are not possible with conventional assembly methods, where all coils are bonded together and disassembly is not possible. Defects in magnetic field homogeneity are conventionally dealt with by use of passive or superconducting shims.

Manufacturing tolerances, such those due to variation in wire dimension, spacer dimension, tooling, resin shrinkage can all be corrected for by machining of the rings after manufacture of coil units 36 and after measurement (plotting) of the homogeneity of the resultant magnetic field.

A further advantage of the present invention is that if, during measurement of the magnetic field as described above, it becomes apparent that one or more of the coils are defective, it is possible to disassemble the magnet structure and replace one or more coil unit(s) 36, rather than discard and replace the whole magnet structure, which would have been the case with conventional methods of assembly.

Once the coil units have been tested and a satisfactory homogeneity achieved, the coil units 36 may be bonded together, for example using a thermosetting resin, to prevent the coil units from moving with respect to one another when in use or during transport.

The coils may be aligned to one another, and assembled, without the need for a conventional former upon which to mount the coils. Such a former conventionally extends radially inside the coils. By avoiding the need for a former, the present invention enables coils of smaller inner diameter to be manufactured, reducing the amount of superconducting wire used, and so reducing the cost of the wire; alternatively, coils of a conventional inner diameter may be used, but a larger free bore may be provided, enabling a larger patient bore to be provided, thereby improving patient comfort.

FIGS. 8-11 show views of further embodiments of the present invention, corresponding to the views of FIGS. 3, 4, 6, 7, in which the rings 30 have a radial extent greater than a radial extent of the coil 100.

Figure 8:
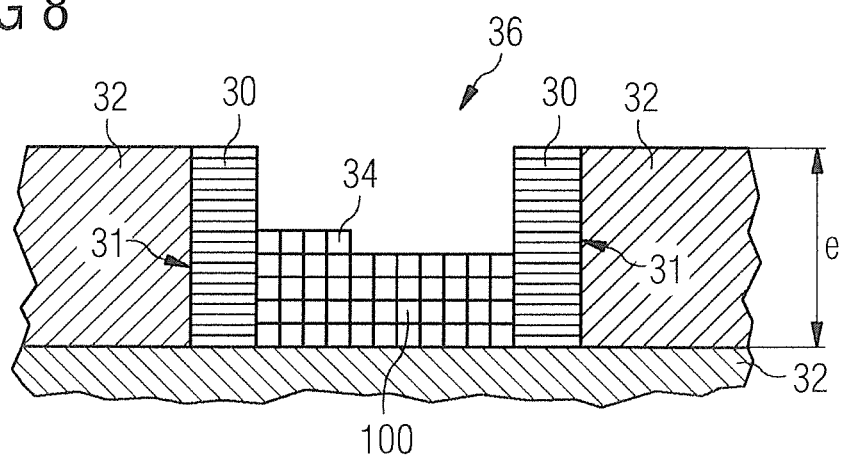
FIG. 8 schematically shows a part-wound coil unit according to another embodiment of the present invention.

FIG. 8 shows superconducting wire 34 being wound between rings 30 to provide a superconducting coil 100. In this embodiment, coil 100 will only partially fill the radial extent e of the rings 30.

Figure 9:
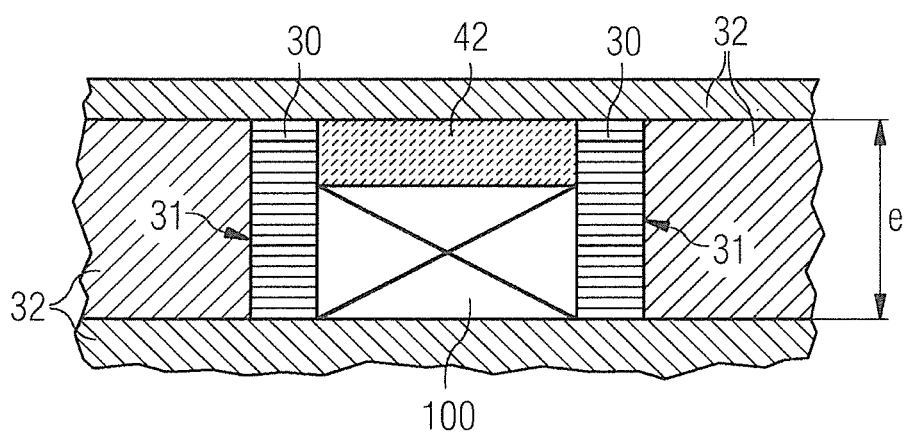
FIG. 9 schematically shows a later step in the production of a coil unit according to an embodiment of the present invention.

As shown in FIG. 9, a filler material 42 is wound onto the radially outer surface of coil 100 to fill the space between the rings 30 over their complete radial extent e. This filler material may be glass fiber cloth or filament, carbon fiber cloth or filament or any suitable material as known to those skilled in the art. The structure is impregnated with thermosetting resin, and released from the mold as for the structure of FIG. 4.

Figure 10:
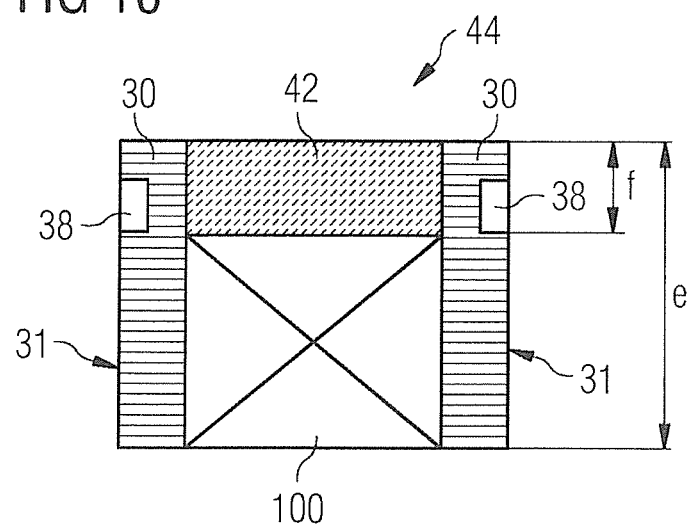
FIG. 10 schematically shows a coil unit according to an embodiment of the present invention.

The result is a radially-extended coil/ring/filler structure 44 as shown in FIG. 10, referred to hereafter as a "coil unit".

Recesses 38 are provided at corresponding locations in the axial faces 31 of the rings 30 of the coil unit.

Figure 11:
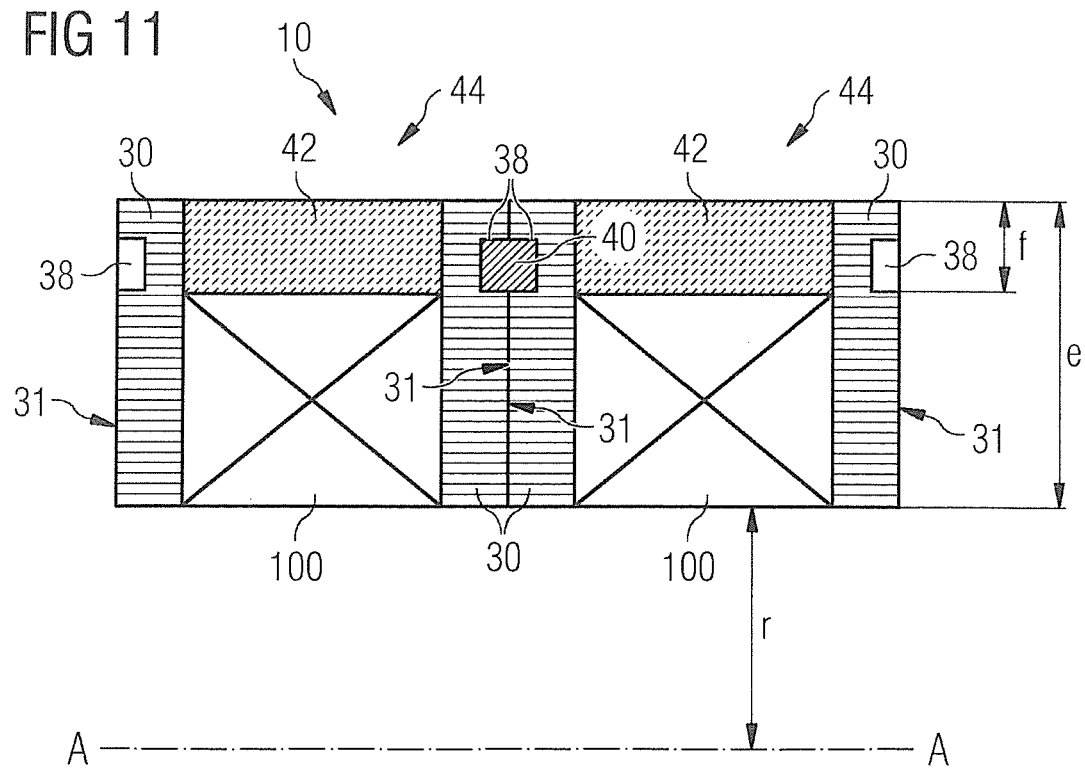
FIGS. 11-13 schematically show coil structures according to certain embodiments of the present invention.

FIG. 11 shows a schematic axial part-cross-section of a partially complete superconducting coil assembly 10 according to an embodiment of the present invention. Two coil units 44 are assembled axially adjacent to one another. They may have the same, or differing axial extents e or proportions. Typically, they will have identical inner radii r, although the present invention does not require this feature. Dowels 40 of a non-ferromagnetic material such as GRP, PTFE, stainless steel, brass or other such materials are placed in the recesses 38 of one ring 30, and when the coil units 44 are assembled together, each dowel 40 protrudes into a corresponding recess 38 in an adjacent coil unit 44. The recesses and dowels should be precisely dimensioned to provide a required degree of alignment of the coils 100. For simplicity in the present description, the dowels will be assumed to be cylindrical, having an axis arranged in an axial direction, parallel to the axis of the magnet coil assembly.

In some embodiments, dowels 40 and recesses 38 fit tightly, to provide precise alignment. In other embodiments, some play is provided by using dowels of smaller diameter than the diameter of the corresponding recess 38, to allow adjustment after assembly, for example before bonding together coil units 36.

Preferably, and as illustrated embodiment of FIGS. 10, 11 the recesses 38 and dowels 40 are positioned at a radial distance from the axis A-A within a radial extent f of filler 42 100 within the corresponding coil unit 44. In this way, any mechanical stresses which concentrate at recess 38 or dowels 40 will be separated from the coil 100 by some distance.

Each coil 100 is flanked on its axial extremities by a non-ferromagnetic ring 30. Recesses 38 are provided in the non-ferromagnetic rings 30, at positions corresponding to positions of recesses in respective rings 30 of adjacent coil units 44 which are to be assembled alongside one another. Dowels 40 are provided, and protrude into corresponding recesses 38 in adjacent coil units 36, 44. By carefully controlling the dimensions and positions of recesses 38 and dowels 40, axial alignment of the coils 100 may be achieved by this arrangement alone.

In arrangements such as shown in FIGS. 8-11, the rings 30 have a greater outer diameter than the outer diameter of the coils 100, and the dowels 40 joining the rings 30 are positioned in recesses 38 which are radially outside of the coils. The dowels and recesses then do not act as stress raisers on the coils.

The dowels 40 may be slightly shorter than the sum of the depths of recesses 38 into which the dowels are placed. This enables the coil units 36, 44 to abut one another by axial end surfaces 31, rather than bearing on one another through dowels 40, which could cause regions of high stress.

In certain embodiments of the present invention, the coil units 36, 44 are bonded together, for example by a thermosetting resin. This may be achieved, for example, by stacking the units 36, 44 and dowels 40 in a mold, preferably arranged with axis A-A vertical, and introducing further thermosetting resin into the mold, to bond the units 36, 44 and dowels 40 together into a superconducting magnet coil structure of the present invention. The thermosetting resin may be introduced under vacuum.

In some embodiments of the invention, where play is left between dowels 40 and recesses 38, the mold may incorporate a jig for precise alignment of coil units 36, 44.

The thermosetting resin may be applied directly to the coil unit surface by various methods, for example by painting, scraping, spraying, or injecting into pools onto the surface and then allowed to spread across the surface under compression of the coil units.

Special channels may be machined into the spacer surfaces 31 to retain and control the spread of resin during the bonding process.

The thermosetting resin used may be similar to the resin used for the coil vacuum impregnation or may be selected to have different properties. For example, a fast curing resin may be preferred, in order to enable a faster magnet assembly, or a weaker strength resin may be preferred, in order to enable easier disassembly of the coil units if a re-work is required.

In other embodiments of the present invention, coil units 36, 44 and dowels 40 may be left unbonded. In such arrangements, mechanical compression should be applied to the axial ends of the magnet coil structure 10, to ensure that all coil units 36, 44 remain in their intended relative positions. A mechanical frame, for example, may be provided around the magnet coil structure 10 to apply pressure to units 36, 44 at axial extremities of the magnet coil structure. Alternatively, metal or plastic tension bands, for example nylon zip ties, may be used to apply and retain axial compression of the coil units 36, 44.

Figure 12:
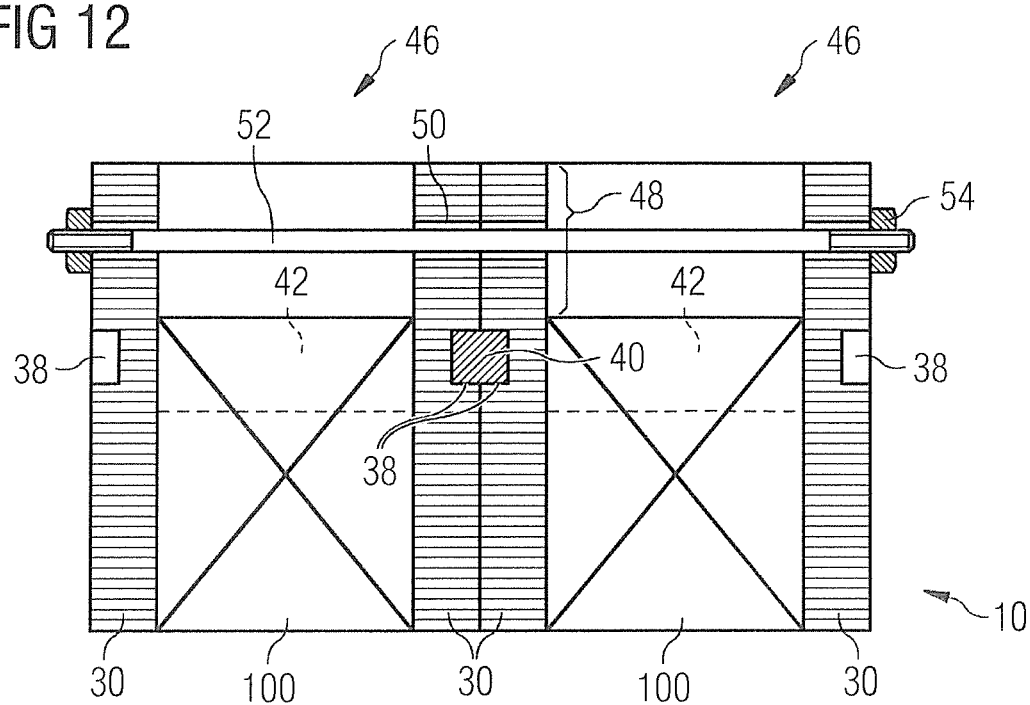

Alternatively, as shown in FIG. 12 for a very simple assembly of two coil units 46, the rings 30 may have a larger outer diameter than the outer diameter of the coils 100 and the filler 42, if used. This leaves a radially outer part 48 of rings 30 which may be provided with through-holes 50. Tension rods 52 may be passed through the holes 50 and suitably fastened 54 at each axial end of the magnet coil structure, for example by threaded nuts onto threaded portions of tension rods 52, to apply compression to the magnet coil structure 10.

In further alternative embodiments, illustrated in FIG. 13, the rings 30 may have a smaller inner diameter than the inner diameter of the coils 100 and the filler 42, if used. This leaves a radially inner part 56 of rings 30 which may be used to support the magnet coil structure 10 on a cylindrical support surface 58, for example a bore tube of a cryogen vessel housing the magnet coil structure. There is some risk of relative movement between inner parts 56 and support surface 58, but the plane of movement is distanced from the coils and is not believed to pose a significant risk of causing quench in the magnet coils 100. In any case, relative movement should only be expected during transport or cool-down, in which case the coils 100 will not be carrying any current; or with a quench in progress, in which case it may be desirable to spread the quench to all coils.

In such an arrangement, a differential expansion or contraction of adjacent coil units during a quench will be managed by a more complex interface in the rings to withstand the large forces. In an example, shown in FIG. 15, conical recesses 80 and protrusions 82 ensure that the coil units 83 remain axially aligned, even in case of differential expansion or contraction.

Such an interface could be machined into the axial faces 31 of the coil units after their initial manufacture. Recesses 38 and dowels 40 as described above may be added to the shaped interface 80, 82.

The described arrangement of coil units 36, 44, 46, recesses 38 and dowels 40 and/or interface 80, 82 may provide a simple method for accurately and rapidly assembling a magnet coil assembly 10, and need not require the provision of a mold large enough to accommodate the whole coil assembly. Such a mold is required for some of the alternative methods of assembling the coil structure from multiple units 36, 44, 46 as described above.

Dowels 40 are preferably provided at several locations, circumferentially distributed around the perimeter of the coils 100, to distribute the loading due to the weight of the coils 100.

Figure 15:
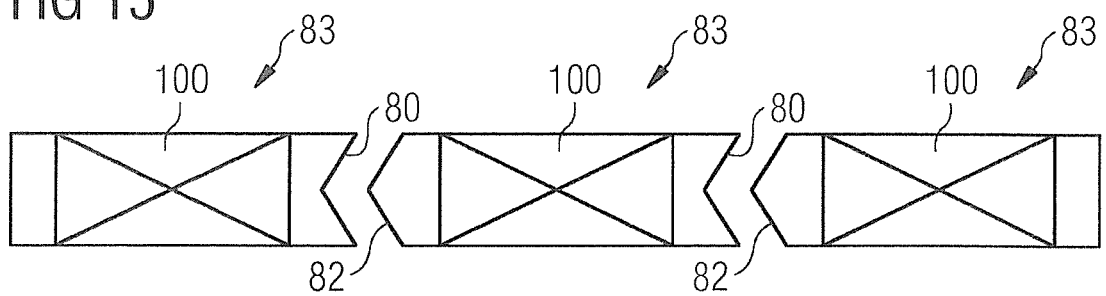
FIG. 15 schematically illustrates complementary recesses and projections formed in axial end-faces of coil units.

FIG. 15 shows a schematic exploded perspective view of two coil units during assembly according to the present invention. Preferably, recesses 38 and dowels 40 are provided at at least three positions around the circumference of each coil unit, preferably at regular intervals. Arrows show directions of assembly according to an embodiment of the present invention.

The interfacing of the coil units by recesses 38 and dowels 40 effectively forms a self-aligning coil structure of individual coil units which does not require a former to provide alignment of the coils.

Non-ferromagnetic rings 30 of coil units 36, 44, 46 make up the spacers 102 described and shown in relation to FIG. 2. Non-ferromagnetic rings 30 of coil units 36, 44, 46 placed at the axial extremities of the resulting coil assembly may be used to retain the assemblies 36, 44, 46 in their required relative positions.

While the present invention has been described by reference to a number of particular embodiments, it will be apparent to those skilled in the art that numerous modifications and variations may be performed within the scope of the present invention.

Filler material 42 may be provided on a radially inner surface of coils 100 instead of, or as well as, being provided on the radially outer surface as shown in FIGS. 9-11.

It may be preferred to arrange recesses 38 and dowels 40 at a smaller radial distance from the axis of the magnet structure, nearer the axis A-A a radially inner surface of coils 100.

One possible arrangement for support of the magnet coil structure 10 is discussed with reference to FIG. 13. Other arrangements may be provided to support the magnet coil structure—for example, tensile rods may be attached to rings 30, bracing the magnet coil structure 10 against the wall of a cryogen vessel, or another part of the cryostat structure. Alternatively, tensile rods 52, as discussed with reference to FIG. 12, may be employed for mechanical support of the magnet coil structure 10. Certain embodiments of the present invention do not require the presence of a cryogen vessel, for example being cooled by a thermosiphon arrangement.

While the described embodiments all feature units comprising a single coil 100 flanked by rings 30, certain embodiments of the present invention may feature units made up of two or more coils, separated by similar rings 30.

Figure 16:
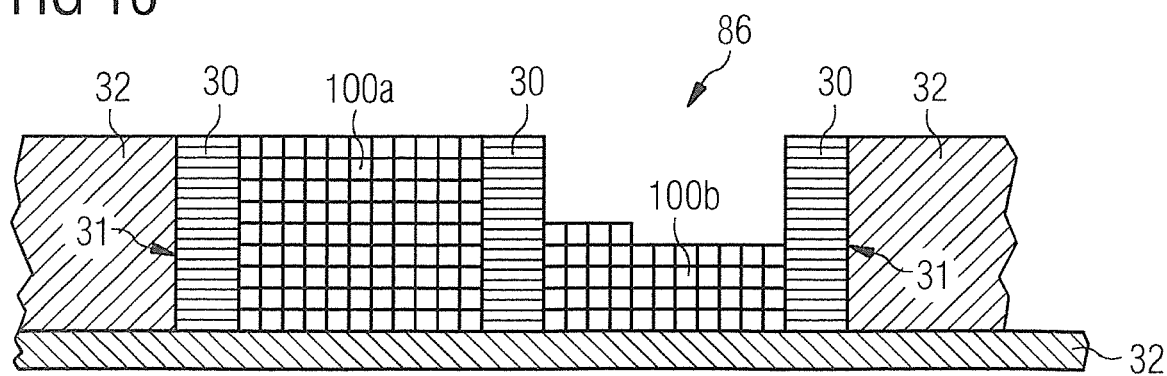
FIG. 16 schematically illustrates a step in the production of a multi-coil unit according to an aspect of an embodiment of the present invention.

FIG. 16 shows an example of a dual coil unit 86 in construction, in a view similar to that of FIG. 3. In this arrangement, a first coil 100a has been formed in the manner described with reference to FIG. 3. A part of the mold 32 has been moved, or removed, to provide a space for winding a second coil 100b. A further ring 30 is provided, so that both coils 100a and 100b are wound between rings 30. This may be arranged by initially providing a removable mold piece in the position of coil 100b. Once first coil 100a is wound and impregnated, the removable mold piece is removed to provide space for winding second coil 100b. Second coil 100b may then be impregnated. In such multi-coil units 86, it is not possible to machine rings 30 between coils 100a, 100b after formation of the coils. Such multi-coil units may be assembled into magnet structures according to any of the methods of the present invention, such as the method proposed with reference to FIGS. 5A-5E.\

The present invention accordingly provides advantageous coil structures and methods for manufacturing coil structures.

The structures and methods of the present invention provide individual manufacture of coils, and assembly of separable coil units, so that defective coils may be removed individually and replaced if necessary.

The coil units have spacer rings 30 bonded at their axial extremities, and these spacer rings may be machined to reduce their axial extent, and to select the axial spacing between adjacent coils in the finished coil structure. This feature may be used to correct for variations in coil manufacture.

These embodiments provide a method to align the positions of the coil units to a very high precision. The coils of the coil structure are aligned to one another without the requirement for a former, allowing reduced cost of increased bore size.

Relatively thin spacers can be provided between coils by the technique of the present invention. As a result, coil structures can be produced with a large proportion of superconducting wire.

The relative position of each coil can be corrected after resin impregnation of the coils.

A test may be performed on the coil assembly at room temperature to plot the homogeneity of the magnetic field generated by the coil assembly, and all of the coils can be repositioned after this test, to improve the homogeneity of the resultant magnetic field.

The coils can be aligned and repositioned both axially and circumferentially.

The coils may be bonded together after manufacture, to prevent unwanted further relative motion.

The present invention enables manufacture of coil arrangements by the coil machining process, which may not be achievable by winding and tooling configurations alone.

In certain embodiments, the coil structure may include coil units aligned and stacked together without coil bonding, thus allowing coil replacement during a rework.

The spacer rings 30 may alternatively can be made up of single tubes; or arc sections butted up together to form continuous rings; or intermittent sections of arcs. Where a spacer ring is built up of intermittent sections of arcs, a gap between adjacent arcs may be used as a leadout to provide access to the end of the wire from the inner turns of the coil.

A benefit of the present invention is that a number of different magnet designs could be manufactured using the same tooling, simply by providing coil units and coils of differing radial and axial dimensions, then assembling them together as required. This can be achieved by changing the width of the spacer rings and the machining of the coil unit after impregnation to provide required coil positions. This approach could also be combined with bonding the coil units to other spacer tubes or blocks.

In yet further embodiments, the inner diameter of the coil 100 may be varied, while using the same mold and tooling, by winding a predetermined thickness of filler material, such as glass fiber cloth onto the winding surface of the mold, thereby to reduce the inner diameter of the formed coil. This allows a further degree of design freedom in each coil unit. Using such techniques, or others, magnet coil assemblies may be constructed from coil units wherein the coils 100 have different inner diameters and/or different outer diameters and/or different axial extents.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method, comprising:
constructing a cylindrical superconducting coil assembly comprising a plurality of individual coil units stacked together and retained in place by retaining structures, each coil unit comprising a resin-impregnated annular superconducting coil bonded at its axial extremities to respective rings of non-ferromagnetic material, wherein the retaining structures comprise complementary recesses and projections formed in axial end-faces of coil units,
wherein the individual coil units are constructed by a method comprising:
placing non-ferromagnetic rings in a mold;
winding superconducting wire into the mold, between the rings, to form a coil;
closing the mold; and
impregnating the resulting ring/coil structure.

2. A method for constructing a cylindrical superconducting coil assembly according to any of claim 1, wherein the mold incorporates a jig for precise alignment of the coil units.

3. A method for constructing a cylindrical superconducting coil assembly according to claim 1, wherein at least one of the coil units comprises a plurality of coils with rings of non-ferromagnetic material located between adjacent coils, further comprising: providing at least one further ring so that all coils are wound between rings; moving or removing a part of the mold to provide a space for winding a second coil; winding a second coil within the space; and impregnating the second coil.

* * * * *